(12) United States Patent
Rich et al.

(10) Patent No.: US 6,354,481 B1
(45) Date of Patent: Mar. 12, 2002

(54) COMPACT REFLOW AND CLEANING APPARATUS

(75) Inventors: Randall L. Rich, Plano; Shean R. Dalton, Koppell, both of TX (US)

(73) Assignee: Speedline Technologies, Inc., Franklin, MA (US)

( * ) Notice: Subject to any disclaimer, the term of this patent is extended or adjusted under 35 U.S.C. 154(b) by 0 days.

(21) Appl. No.: 09/435,650

(22) Filed: Nov. 8, 1999

Related U.S. Application Data

(63) Continuation-in-part of application No. 09/252,377, filed on Feb. 18, 1999.

(51) Int. Cl.[7] .............................. B23K 1/00; B23K 5/22; F27D 11/00
(52) U.S. Cl. ..................... 228/19; 228/201; 228/218; 219/388; 134/105
(58) Field of Search .................. 228/218, 227, 228/19, 201, 42; 118/503; 134/105; 219/388

(56) References Cited

U.S. PATENT DOCUMENTS

| | | | | |
|---|---|---|---|---|
| 3,639,142 A | * | 2/1972 | Maxwell et al. | 117/51 |
| 4,682,563 A | * | 7/1987 | Masuda et al. | 118/503 |
| 5,181,648 A | * | 1/1993 | Leicht | 228/201 |
| 5,192,582 A | | 3/1993 | Liedke et al. | 228/206 |
| 5,345,061 A | * | 9/1994 | Chanasyk et al. | 219/388 |
| 5,374,331 A | * | 12/1994 | Costello | 156/640 |
| 5,388,327 A | | 2/1995 | Trabucco | 29/830 |
| 5,433,368 A | * | 7/1995 | Spigarelli | 228/8 |
| 5,440,101 A | * | 8/1995 | Cox et al. | 219/388 |
| 5,492,265 A | * | 2/1996 | Wandke | 228/205 |
| 5,524,810 A | | 6/1996 | Wathne | 228/42 |
| 5,553,633 A | | 9/1996 | Ciccarelli, Jr. et al. | 134/72 |
| 5,599,398 A | * | 2/1997 | Lenglen | 134/1 |
| 5,611,476 A | * | 3/1997 | Soderlund et al. | 228/42 |
| 5,632,813 A | * | 5/1997 | Nakagawa et al. | 118/58 |
| 5,722,581 A | * | 3/1998 | Sindzingre et al. | 228/206 |
| 5,814,789 A | * | 9/1998 | O'Leary et al. | 219/388 |
| 5,873,449 A | * | 2/1999 | Davenport | 198/370.09 |
| 5,922,230 A | * | 7/1999 | Yokota | 219/388 |
| 5,993,500 A | * | 11/1999 | Bailey et al. | 55/385.6 |
| 6,015,966 A | * | 1/2000 | Rehm | 219/388 |

FOREIGN PATENT DOCUMENTS

| | | | | |
|---|---|---|---|---|
| EP | 0864391 A1 | 9/1998 | | B23K/1/008 |
| EP | 0885084 A1 | 12/1998 | | B23K/1/008 |
| JP | 01152636 | 6/1989 | | H01L/21/52 |
| JP | 05267825 | 10/1993 | | H05K/3/24 |
| JP | 07155938 | 6/1995 | | B23K/1/30 |
| WO | WO9707924 | 3/1997 | | B23K/3/04 |
| WO | WO0048780 | 8/2000 | | B23K/1/20 |

* cited by examiner

Primary Examiner—Tom Dunn
Assistant Examiner—Lynne Edmondson
(74) Attorney, Agent, or Firm—Mintz, Levin, Cohn, Ferris, Glovsky and Popeo, P.C.

(57) ABSTRACT

A compact reflow oven and cleaning apparatus combines in a unitary housing for both the reflow and cleaning function. This results in the saving of valuable floor space in the printed circuit board assembly areas. The unitary housing and control of temperatures in the reflow and cleaning areas facilitate the removal of contaminants before solidification of such contaminants.

27 Claims, 10 Drawing Sheets

COMPACT REFLOW AND CLEANING APPARATUS

RELATED APPLICATIONS

This application is a continuation-in-part application of U.S. application Ser. No. 09/252,377, filed Feb. 18, 1999, which is incorporated herein by reference.

FIELD OF THE INVENTION

This invention relates to the processing of electronic components and assemblies, and in particular to the reflow of solder and cleaning of the components.

BACKGROUND OF THE INVENTION

The manufacture of electronic assemblies and components commonly involves the mounting of individual electronic devices, such as transistors, integrated circuits, resistors and the like on pre-printed circuit boards. The assemblies and components are then reflowed and often cleaned.

The manufacture of Ball Grid Array (BGA) components and assemblies commonly involves the mounting of solder balls or prepared spheres on pre-printed circuit boards or substrates on the bottom surface of an integrated circuit, such as a so-called flip chip. In a typical process, the circuit boards and substrates will be processed through a line of machines which include a magazine unloader, a ball mounter, an inspection machine, a 1 to 3 converter, a reflow apparatus, a cleaning apparatus, a 3 to 1 converter and a magazine loader. These machines take considerable floor space and limit the production line that can be utilized in a given amount of relatively expensive floorspace. After mounting, reflow and cleaning, the BGAs become the input/output paths for electron flow to the next level assembly.

Since most assembly of BGA components and assemblies is performed in a clean room environment with very expensive floor space costs, there is an ongoing need to conserve floorspace. Thus, it would be of great benefit to provide greater efficiency to the manufacturing process and to reduce the required floor space for the manufacturing process.

SUMMARY OF THE INVENTION

In accordance with one aspect of the present invention, an apparatus is providing for processing electronic components which travel along first and second conveyors in a pre-determined direction. The apparatus includes a frame contained in unitary housing. A reflow assembly is mounted on the frame within the unitary housing and has a reflow conveyor conveying the electronic component from the first conveyor in a reflow direction non-parallel to the pre-determined direction to reflow solder on the electronic component. The apparatus also has a cleaning assembly mounted on the frame also within the unitary housing and has a cleaning conveyor conveying the electronic component from the reflow conveyor in a cleaning direction generally opposite to the reflow direction to clean the electronic component and deliver the electronic component to the second conveyor.

In accordance with another aspect of the present invention, the reflow direction and cleaning direction are perpendicular to the pre-determined direction.

In accordance with another aspect of the present invention, a unitary compact reflowing and cleaning apparatus is provided and is specially suited for the reflowing and cleaning of BGA components of silicon chips which are manufactured in either strip form or individually held in JEDEC type trays, boats or carriers, in contrast to the typically larger sized printed circuit boards for which most of the present commercial reflow ovens and cleaning devices are designed.

In yet another aspect of the present invention through the use of selective blower manipulation and the utilization of negative pressure, a reflow oven and cleaner may be housed within a unitary housing without the risk of contamination of one process by the other process taking place within that same unitary housing.

In accordance with yet another aspect of the present invention, the cleaning portion of the apparatus operates with a cleaning fluid at a temperature more elevated than is typical with present commercial cleaners. The heightened temperature of the fluid within the cleaning apparatus minimizes the temperature difference between strips or trays exiting the reflow portion of the apparatus and allows a reflow and cleaning more rapidly than with the typical present day installations. This is because, in the apparatus of the present invention, the BGA components or chips contained in the strips or in JEDEC trays, boats or carriers, do not cool down as much and therefore can be cleaned sooner since they are cleaned prior to reaching room temperature and before typical contaminants present after reflow fully solidify or cure.

In accordance with yet another aspect of the present invention, the reflow portion of the apparatus of the present invention utilizes IR heating to rapidly reflow the BGA components or other chips in either strip form or held in JEDEC trays, boats or carriers. Convection or conduction heating may alternatively be used.

In accordance with a further aspect of the present invention, the reflow and cleaning apparatus is equipped with a convection-type reflow heating system. The convection-type reflow heating system is disposed in the reflow assembly portion of the reflow and cleaning apparatus and comprises a number of zones including an entry isolation zone disposed at the entry point of the reflow convener, at least one reflow heating zone disposed adjacent to the entry isolation zone, a reflow-to-cooling zone disposed adjacent to the reflow heating zone, a cooling zone disposed adjacent to the reflow-to-cooling zone, and an exit isolation zone disposed adjacent to the cooling zone and at the exit point of the reflow conveyor. The convection heating system also includes a air or inert gas distribution system disposed in the reflow assembly for delivery and recirculation of heated air or gas to the reflow heating zone and delivery of cool air or gas to the cooling zone. The air or inert gas reflow and cooling temperatures are monitored and maintained by thermocouples and appropriate circuitry of the reflow and cleaning apparatus which are well known in the art for the control of air or gas temperature.

The entry isolation zone separates the ambient temperature of the reflow and cleaning apparatus from the elevated temperature of the reflow heating zone. Similarly, the exit isolation zone separates the elevated temperature of the reflow assembly from the ambient temperature of the cleaning and reflow apparatus. The entry and the exit isolation zones function as areas of static atmosphere to isolate the different temperatures of the reflow assembly zones and to achieve and maintain a uniform reflow temperature within the reflow heating zone. Each isolation zone is equipped with an exhaust port to exhaust airborne flux particulates and other contaminants from the reflow assembly to the atmosphere external to the reflow and cleaning apparatus.

The air or inert gas distribution system discharges reflow air or inert gas to the reflow heating zone and includes blowers disposed above and below the reflow conveyor. The blowers draw air or inert gas through heaters disposed along each side of the reflow conveyor and into side intake ducts coupled to the heaters. The side intake ducts deliver heat and air or inert gas to a plenum disposed above and below the reflow conveyor. Each plenum is uniformly and positively pressurized by the intake of heat and air or gas. The positive pressure in each plenum creates a mixing action whereby heat and air or gas are mixed to create a uniform air or gas reflow temperature. The reflow air or gas is uniformly discharged from each plenum through a multiple number of perforations or through holes in a surface of each plenum which is in facing relation to the reflow conveyor. The plenum disposed above the reflow conveyor discharges air or gas to a top surface of the reflow conveyor and the plenum disposed below the reflow conveyor discharges air or gas to a bottom surface of the reflow conveyor. The discharged air or gas reflows the BGA components and chips contained on the reflow conveyor by convection or the transfer of thermal energy to the BGA components and chips. Discharged air or gas is subsequently recirculated to the heaters and the side intake ducts by the drawing action created by the blowers.

In a version of the present embodiment in which the air or gas distribution system provides only inert gas, such as nitrogen, the delivery of such inert gas purges oxygen from the reflow assembly to create an inert environment. The entry isolation zone and the exit isolation zone are each further equipped with a seal to enhance the function of each zone to isolate the temperature of the reflow heating zone from other zones in the reflow assembly. In addition, each seal minimizes the consumption of inert gas required to maintain an inert atmosphere in the reflow assembly. Each seal also prevents oxygen from entering the reflow assembly and inert gas from exiting the reflow assembly.

The reflow-to-cooling zone of the reflow assembly functions to isolate the elevated temperature of the reflow heating zone from the cooler temperature of the cooling zone. The reflow-to-cooling zone also prevents the transfer of heat and air or gas from one zone to another. The reflow-to-cooling zone may be equipped with an exhausting device to extract airborne flux particulates and other contaminants from the reflow-to-cooling zone. Removal of such contaminants reduces the level of contamination of the BGA components and chips caused by the condensation of such contaminants onto the BGA components and chips in cooler zones of the reflow assembly.

The cooling zone of the reflow assembly is equipped with at least one blower disposed above the reflow conveyor. The blower discharges cool air drawn from the ambient atmosphere of the reflow and cleaning apparatus to the top surface of the reflow conveyor to cool the BGA components and chips contained on the reflow conveyor. Similarly, a second blower may be disposed below the reflow conveyor to discharge cool air to the bottom surface of the reflow conveyor.

In a version of the present embodiment wherein inert gas is circulated by the distribution system, the cooling zone is equipped with a cooling radiator disposed below the reflow conveyor. The cooling radiator is coupled to either a gas knife, blower or other similar device to discharge cool inert gas into the cooling zone. The gas knife or blower draws inert gas from the reflow and cleaning apparatus and over a surface of the cooling radiator to cool the inert gas prior to discharge into the cooling zone. The drawing action of the gas knife or blower increases the effective volume of the inert gas discharged into the cooling zone to cool the BGA components and chips conveyed on the reflow conveyor.

The amount of convection or thermal energy transfer to the BGA components and chips as such components are conveyed through the reflow assembly is dependent upon the temperature of each zone, the convection velocity and the speed at which the components are conveyed through the reflow assembly.

BRIEF DESCRIPTION OF THE DRAWINGS

A more complete understanding of the invention and its advantages will be apparent from the following detailed description when taken in conjunction with the accompanied drawings, in which.

DETAILED DESCRIPTION OF THE INVENTION

Figure 1:
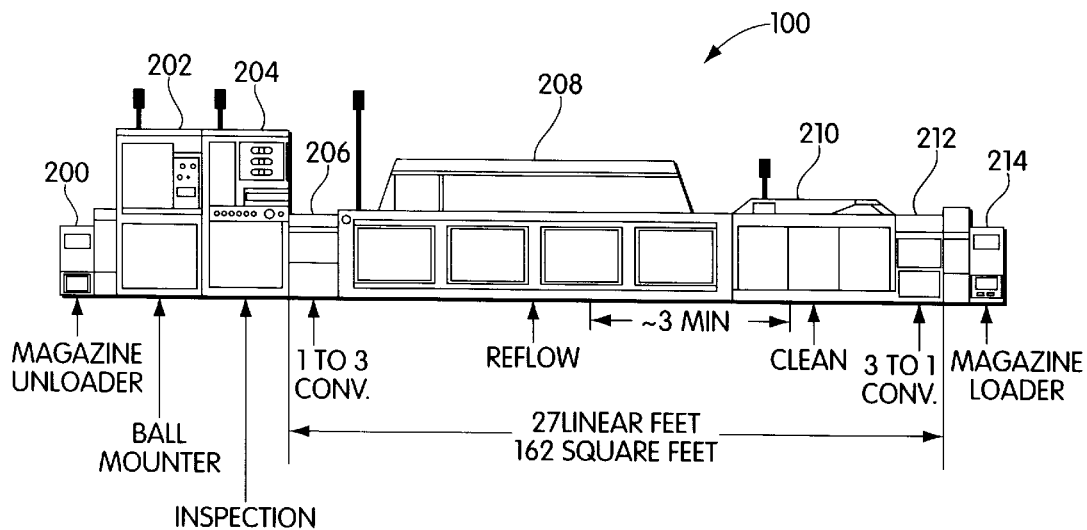
FIG. 1 illustrates a conventional processing line.

Referring now to the drawings, wherein like reference characters designate like or corresponding parts throughout the several views, an improved combined reflow and cleaning apparatus 10 will be described.

With reference to FIG. 1, a conventional, present-day, commercially-available electronic manufacturing line 100 is illustrated. The line begins with a magazine unloader 200, a ball mounter 202, an inspection apparatus 204 and a 1 to 3 converter 206. Typical manufacturers of such equipment are Motorola, Vanguard, Shibuya, Panasonic-KME and Speedline Technologies, Inc. It is to be understood that the sequence of machines in the electronic manufacturing line may be reversed and thus instead of the process moving left to right it may move in a right to left direction.

The manufacturing line 100 illustrated is a line which is particularly adopted for the placement of the small solder spheres which have been referred to above as BGAs onto the surface of integrated circuits, or onto the surface of an interposer upon which the integrated circuit is mounted. These BGA components are small and can be thought of as being small circuit boards having a number of solder spheres or BGAs placed and affixed to their bottom surfaces. In operation, the ball mounter 202 is utilized to mount a number and perhaps a large number of BGAs on the underside of the component. Eventually the component with attached BGAs will be mounted upon a larger printed circuit board but the BGAs must be more or less permanently attached to the component. This is conventionally performed by reflowing the solder contained within the BGAs and then cleaning the BGAs and component to which they are attached of flux and other contaminants which arise from the reflow process in a conventional manner.

Following the 1 to 3 converter 206 is a reflow apparatus 208 to reflow solder on the circuit boards. Such apparatus can be obtained from Research Int., Dover—Vitronix, Electrovert, Heller and BTU. Subsequent to the reflow apparatus 208 is a cleaning apparatus 210 to clean flux residues and other contaminants from the circuit boards. Cleaning apparatus can be supplied from GPD, Dover—Vitronix and Accel. Following apparatus 210 is a 3 to 1 converter 212 and another magazine loader 214. The linear distance encompassed by the devices between the 1 to 3 converter 206 and the 3 to 1 converter 212 can be, for example, typically 27 linear feet, with the apparatus, in combination, taking up 162 square feet of floor space. The cost of the units would be at present between $200,000 and $250,000 and must be supplied from three different vendors.

Figure 2:
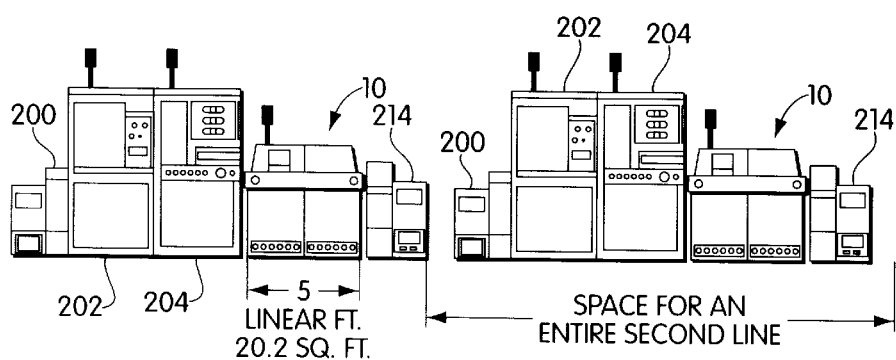
FIG. 2 illustrates a processing line incorporating a first embodiment of the present invention.

The present invention provides a reflow and cleaning apparatus 10 which can be used in place of the apparatus 206, 208, 210 and 212. The reflow and cleaning apparatus 10 may take only five linear feet of the assembly line, and 20 square feet of floor space, saving considerable space as compared to the prior apparatus. As is well know, the cost of floor space in a semi-conductor or printed circuit board or other electronic assembly line is extremely expensive due to, among other things, environmental controls, the need for temperature and cleanliness standards, etc. By utilizing the reflow and cleaning apparatus 10 of the present invention, considerable cost savings can be realized. The cost could be competitive with the apparatus replaced and can be supplied by a single vendor. As illustrated in FIG. 2, the same linear distance formerly required for one manufacturing line, as illustrated in FIG. 1, can be, using the reflow and cleaning apparatus 10, used for two completely separate manufacturing lines.

With reference now to FIGS. 3–12, the reflow and cleaning apparatus 10, which forms a first embodiment of the present invention, will be described. The apparatus 10 includes a frame 12 which mounts a reflow assembly 14 for reflowing solder on circuit boards 15, mounted on strips (FIG. 3) or in trays, boats or carriers, 62 (FIG. 5) and a cleaning assembly 18 for cleaning the circuit boards 15 after the reflow operation.

Figure 3:
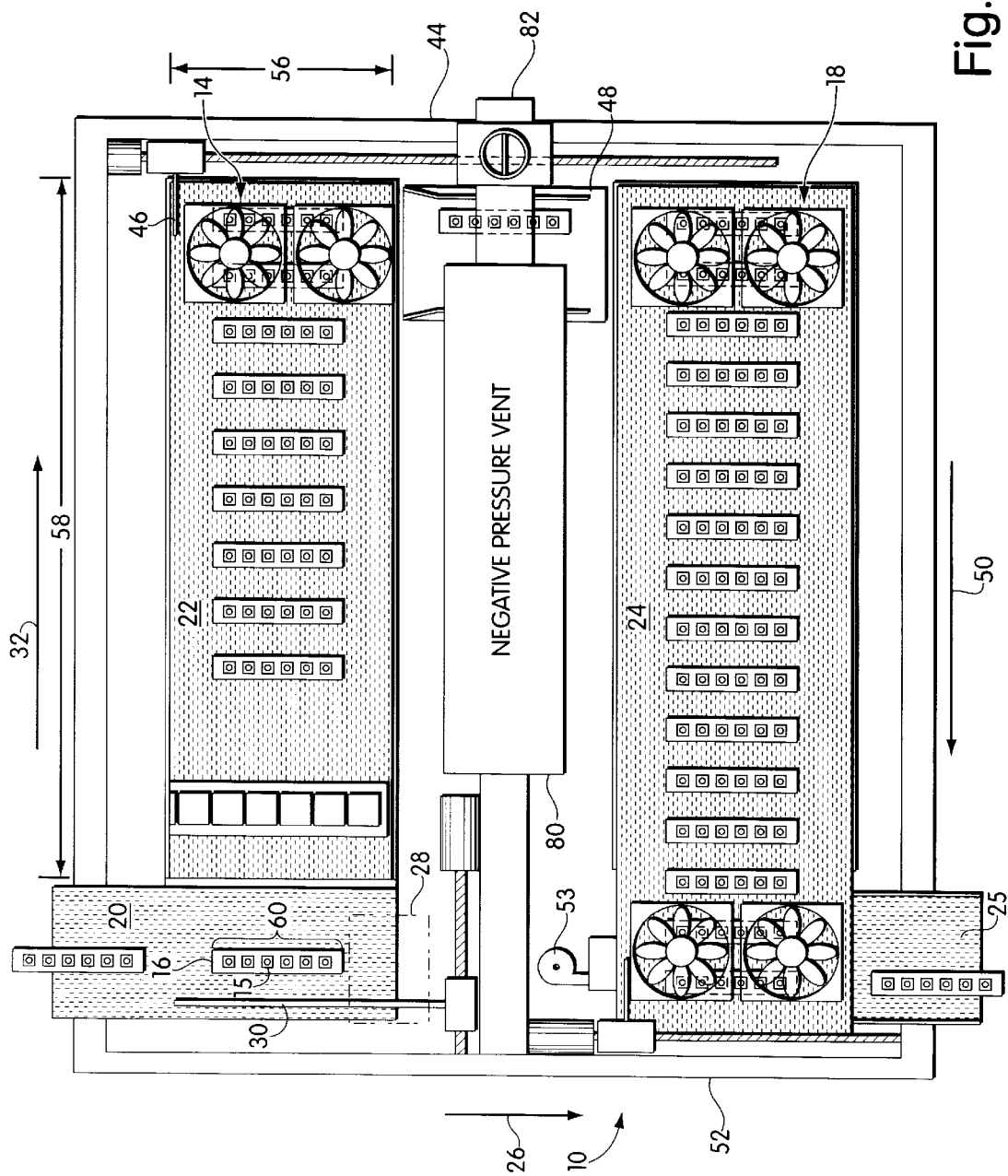
FIG. 3 is a plan view of the first embodiment of the present invention illustrating the conveyor paths for use with the strips.
Figure 12:
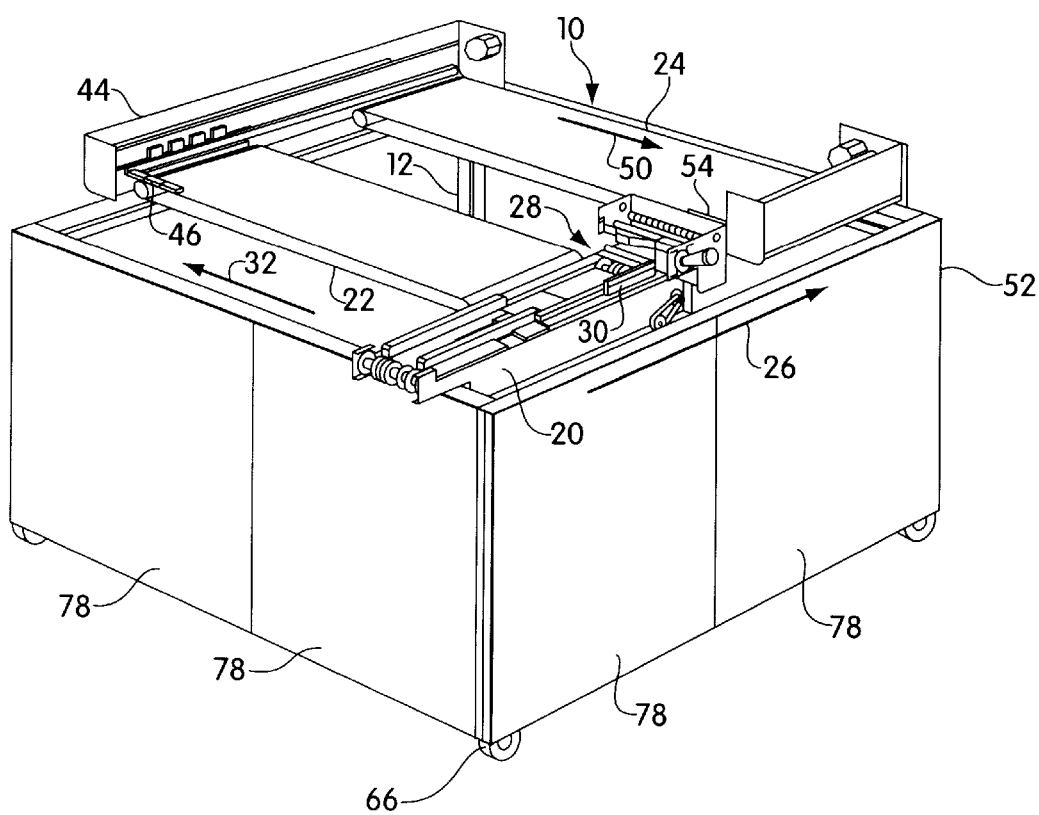
FIG. 12 is a perspective view detailing the conveyor apparatus of the embodiments of FIGS. 3–5.

As can be seen in FIGS. 3 and 12, the apparatus has a series of conveyors, including an inlet conveyor 20, a reflow conveyor 22, and a cleaning conveyor 24. The inlet conveyor 20 will take the BGA components 15 in strip forms 16 (FIG. 3) or individually in trays, boats or carriers 17 (FIG. 5) to be processed from the inspection apparatus 204 and convey the components along the linear direction 26 of the manufacturing line. As a strip 16 approaches the inner end 28 of the inlet conveyor 20, sensors of a well-known type in the art in the apparatus will cause sweeping members 30 to move from the position shown in FIG. 12 toward the reflow conveyor 22 in a direction 32 perpendicular to the linear direction 26 to move the strip 16 onto the beginning of the reflow conveyor 22. The reflow conveyor 22 conveys the strip 16 along a reflow direction 32, which is generally perpendicular to the linear direction 26.

Figure 4:
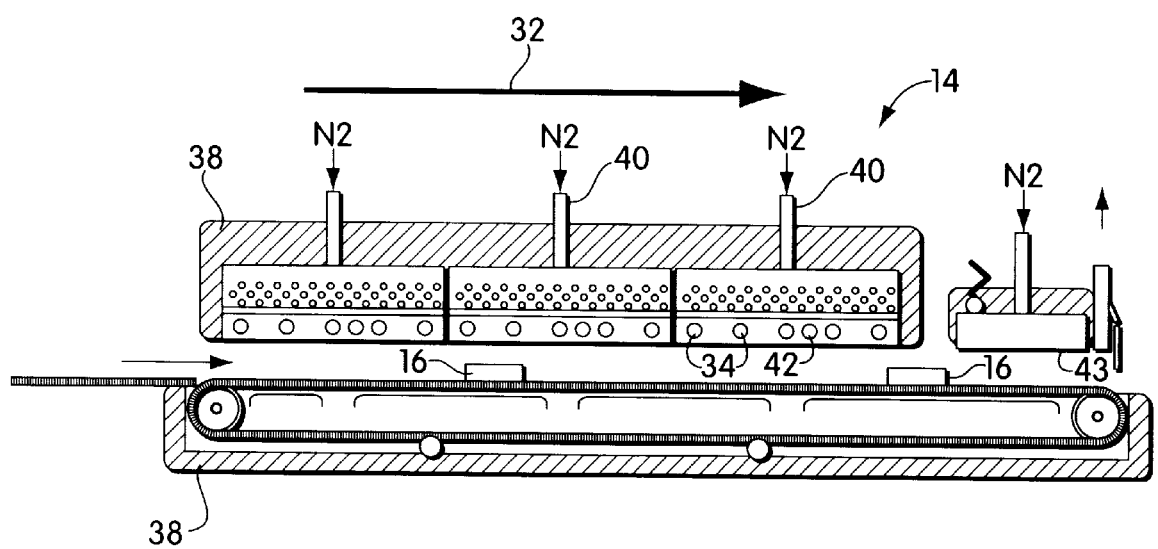
FIG. 4 is a partial side view of the reflow assembly.

With reference to FIG. 4, as the strips 16 are conveyed along the reflow conveyor 22, they are heated by heating members 34 to reflow the solder on the boards. The heating members 34 can, for example, be heat lamps, but may also be of convection or conduction type. The reflow assembly 14 provides insulation 38 to confine the elevated temperature to the reflow assembly. If desired, nitrogen gas can be supplied to the reflow assembly through inlets 40. The temperature within the reflow assembly 14 is controlled by the use of thermocouples 42 which are monitored by appropriate circuitry within the apparatus 10. Preferably the heating members 34 may comprise IR-type heaters rather than the more conventional convection heaters which are used in many reflow ovens.

An advantage of an IR-type heater is that it can bring the solder to reflow temperature more quickly than a conventional convection-type heating system and thus reflow can be accomplished more quickly and with the use of less energy. In conventional reflow ovens, large size printed circuit boards which are reflowed typically have a number of different components to be affixed to the board. These components may, and often do, differ greatly in their color. For example, while some integrated circuits may be black and thus tend to absorb heat, other elements such as capacitors or other discreet devices may be light in color such as white or yellow, which have differing heat and absorption characteristics than black devices.

In addition, the printed circuit board itself which may be typically of a dark green tone may have a heat absorption which differs from the heat absorption characteristics of the devices which are to be mounted upon the printed circuit board. This causes or can cause differential heating of the devices and thus differential reflow rates which is undesirable.

With the device of the present invention, however, the apparatus is especially suited for the reflow of BGAs mounted upon the undersides of integrated circuits. In these arrangements, each of the BGA components contained in the strips or the JEDEC trays, boats or carriers are generally of uniform color in that there is no or little variation within the BGA components of the strip or the JEDEC trays, boats or carriers. Thus, IR-type heating can be utilized to heat either strips or trays, boats or carriers without the reflow differential problems discussed above. It should be noted that at the end of the reflow cycle, that is, after the strip 16 shown in FIG. 4 passes the last heating member 41, the strip 16 will proceed along the belt 22 to a cooling zone 43 which may utilize chilled water or other refrigerant or a Peltier-type device to further cool down the strip after reflow, if desired.

With reference to FIG. 3 AND FIG. 12, as the strips 16 approach the back 44 of the apparatus 10 near the back end of the reflow conveyor 22, appropriate sensors in the apparatus move sweeping members 46 from the position shown in FIG. 12 along the linear direction 26. The sweeping members 46 move the strips 16 off of the reflow conveyor 22, over a flat stationary surface 48 and onto the beginning of the cleaning conveyor 24. After the sweeping members 46 convey strip 16 from the reflow conveyor 22 to the cleaning conveyor 24, the sweeping members 46 are retracted to the position shown in FIG. 12 ready to push the next strip 16 moving toward the end of the reflow conveyor 22.

The cleaning conveyor 24 will move the strips from the back 44 in a cleaning direction 50 which is also generally perpendicular to the linear direction 26 and in the opposite direction to the reflow direction 32, toward the front 52 of the apparatus 10. As the strips 16 move through the cleaning assembly 18, the circuit boards 15 are cleaned. The cleaning of the circuit boards maybe achieved by a fog of water vapor or water at about 95° C. However, more conventional cleaning techniques may be used.

In conventional reflow/cleaning processes, the printed circuit board will go through an inline reflow oven operation which oven typically includes a cool down section which lowers the temperature of the board or other electronic assembly to aid in reflow solidification. The board is then removed from the reflow oven and conveyed to the next inline piece of equipment which is the cleaner. It is well known in the art that once a board or other electronic assembly has been cooled down, various contaminants such as flux and other materials may partially or fully solidify or cure on the board and/or devices mounted on the board. Thus, in the cleaning process following the reflow process, the cleaning water must bring up the temperature of the board or other electronic assembly to a temperature where the fluxes and other contaminants may be washed off. By contrast, in the present invention in which the reflow oven and the cleaner are within a common housing, the reflow oven includes a programmable cooling assembly and the heating water in the cleaning section uses high temperature water or even water vapor at elevated temperatures. The control of the temperatures in the reflow section and the changing sections may be any of a number of well-known heating and temperature control methods. With the use of the present invention, the board, chip or other electronic assembly will not have sufficient cool down time to cause curing of flux or other contaminants on the board but rather such contaminants will remain in an incured, semi-solid state. They will be conveyed almost immediately from the reflow path to the cleaning path and, because temperature differential between the exit from the cooling reflow path and the entrance of the cleaning path is short fluxes and other contaminants may be easily washed off in the cleaning portion of the present invention since the fluxes or other contaminants will not have cured. This provides substantial savings in time within which to process an individual board, strip or tray, as well as saving on energy that would require the repeated heating and cooling of the printed circuit board, strip or tray, boat or carrier with mounted chips.

Furthermore, an additional advantage of the temperature control of the present invention is that the printed circuit board or strip or JEDEC tray, boat or carrier will emerge from the cleaning section hotter in temperature than from conventional cleaners, thus allowing rapid drying of the devices due to the evaporation of water vapor due to the higher temperature of the devices mounted in the strips 16 or the JEDEC trays, boats or carriers, 18. Typically, a reflow temperature in the reflow portion of the oven will be in the vicinity of 360° Fahrenheit but may vary from about ambient to about 600° F., but usually not less than about approximately 375° F. during reflow operation. Typically, cleaners comprise a wash section and a rinse section. The typical temperature of the water in the cleaning section may range from 120–160° F. for the wash section and 120° F.–210° F. for the rinse section. Suitable temperatures are about 145° F. for the wash water and about 210° F. for the rinse water, but generally not less than about approximately 145° F. In either case, it is desirable that the temperature of an electronic component leaving the reflow assembly not be below that of the temperature of the wash water in the washing section. By well known means and temperature control devices, these temperatures may be maintained by regulation of the heating in the reflow and cleaning sections.

Furthermore, with the containment of both the reflow oven and the cleaning apparatus within a unitary housing and with control of closely controlled temperatures, as discussed above, and further by control of the speed of the belts 22 and 24, the total average time of processing of a single strip or JEDEC tray, boat or carrier, can be reduced by a full three minutes or more in a process which would normally take in the conventional line shown in FIG. 1 of between 7 and 10 minutes. Thus, in the present device, cleaning begins to take place after reflow within 15–45 seconds after the strip or JEDEC tray, boat or carrier, containing components leaves the reflow portion of the present apparatus.

Additionally, the end portion of the conveyor 24 in the cleaning section may include a heat blower 53 which blows heated air onto the upper or upper and lower surfaces of the strip 15 or tray 18 to further dry the devices after the cleaning process, thus augmenting drying by evaporation of water vapor from the devices.

As the strips 16 approach the end of the cleaning conveyor 24 near the front 52 of the apparatus 10, sensors will sense their presence and activate sweeping members 54 to sweep the strips 16 off of the cleaning conveyor 24 along the linear direction 26 and push the strips onto shoot 25 and out of the apparatus 10 into the next stage of the production line.

As will be clear from FIG. 3, the ratio of the width 56 to length 58 of the reflow conveyor 22 and similar dimensions of cleaning conveyor 24 are important. As illustrated, the strips 16 will enter the apparatus 10 with their elongate length 60 parallel the linear direction 26. This orientation is maintained throughout the apparatus 10 as the width 56 of the reflow conveyor and width of the cleaning conveyor are adequate to accommodate the elongate length 60 of the strips. Generally, the linear speed of the inlet conveyor 20 will exceed that of the reflow and cleaning conveyors. For example, the inlet conveyor 20 may move in the linear direction 26 between 12 to 84 inches per minute. 60 inches per minute would equate to four trays 62 per minute, while 84 inches per minute would equate to ten strips 16 per minute. In contrast, the reflow conveyor 22 and cleaning conveyor 24 may be operated in a range of 3 to 24 inches per minute. The process speed may be 24 inches per minute for 10 strips per minute or 20 inches per minutes for 3 trays per minute. The length 58 of the reflow conveyor and length of the cleaning conveyor should be sufficient so that the outlet of strips 16 and trays 62 from the apparatus 10 occurs at the same rate as the inlet of strips 16 and trays 62 at the inlet conveyor 20. While the time interval between the completion of the reflow operation and the beginning of the cleaning operation may vary, it may be desirable with the present invention to fix that interval anywhere from 1 to 120 seconds, and even preferably less than 120 seconds.

Figure 5:
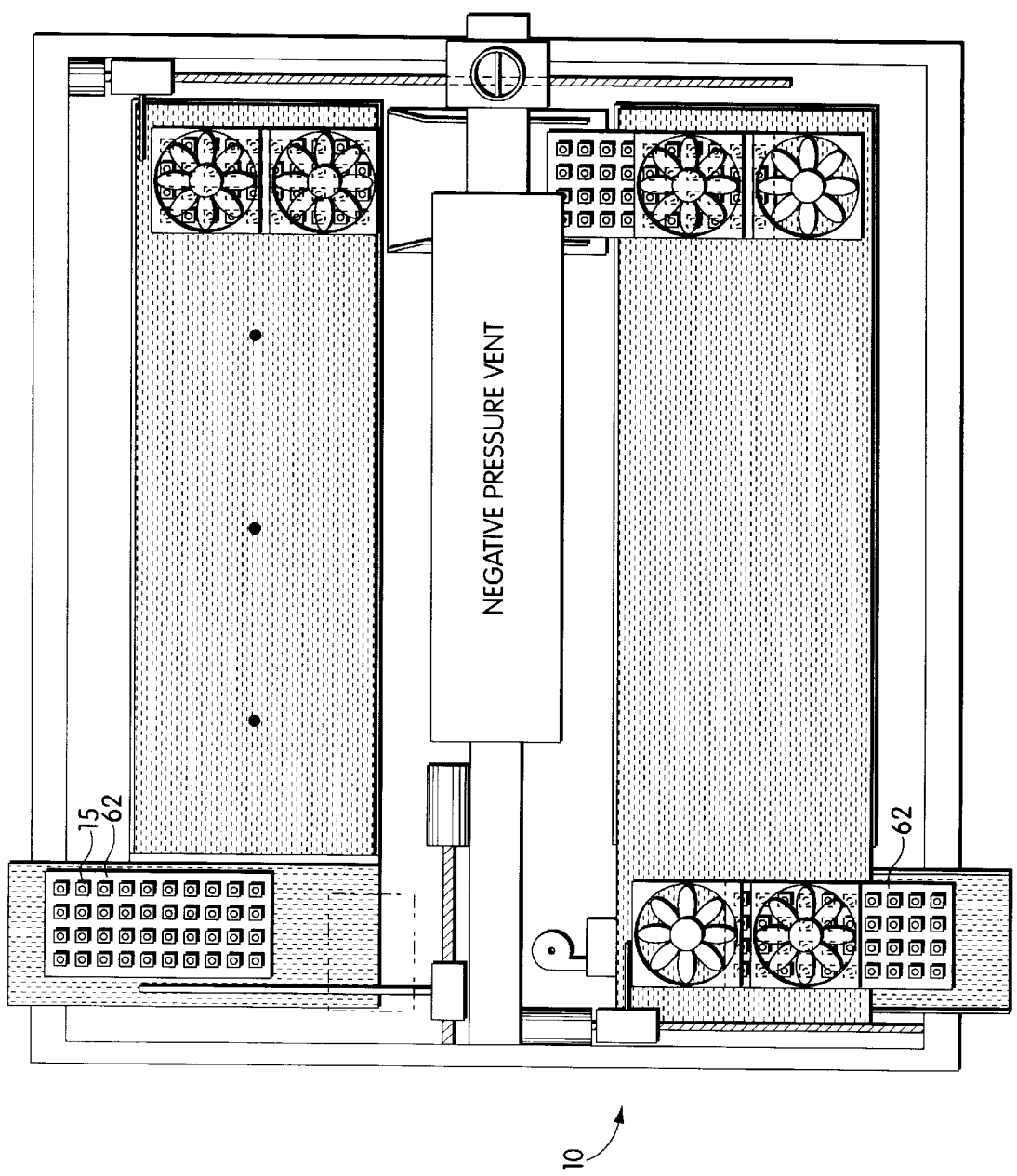
FIG. 5 is a plan view of the first embodiment of the present invention illustrating conveyors for trays.
Figure 6:
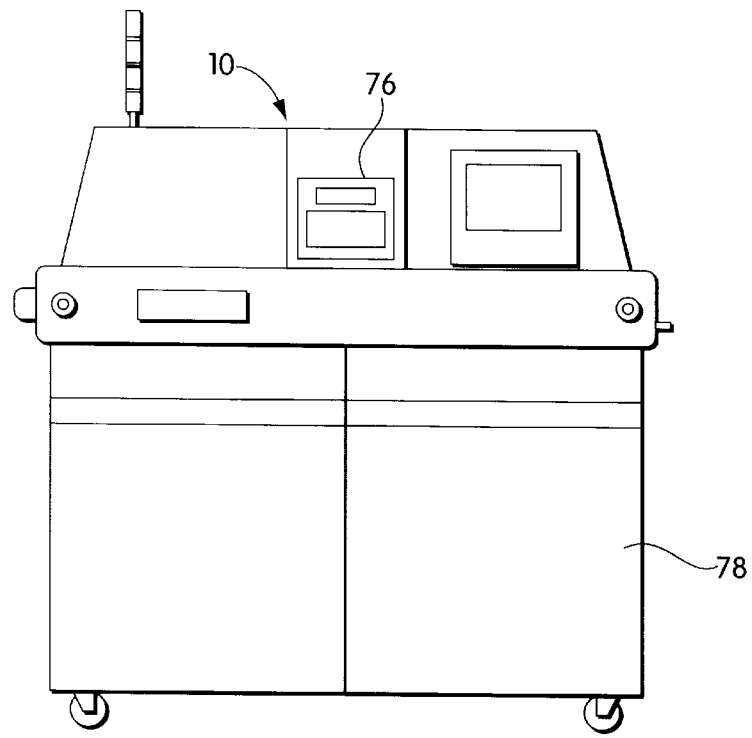
FIG. 6 is a front view of the embodiment.
Figure 7:
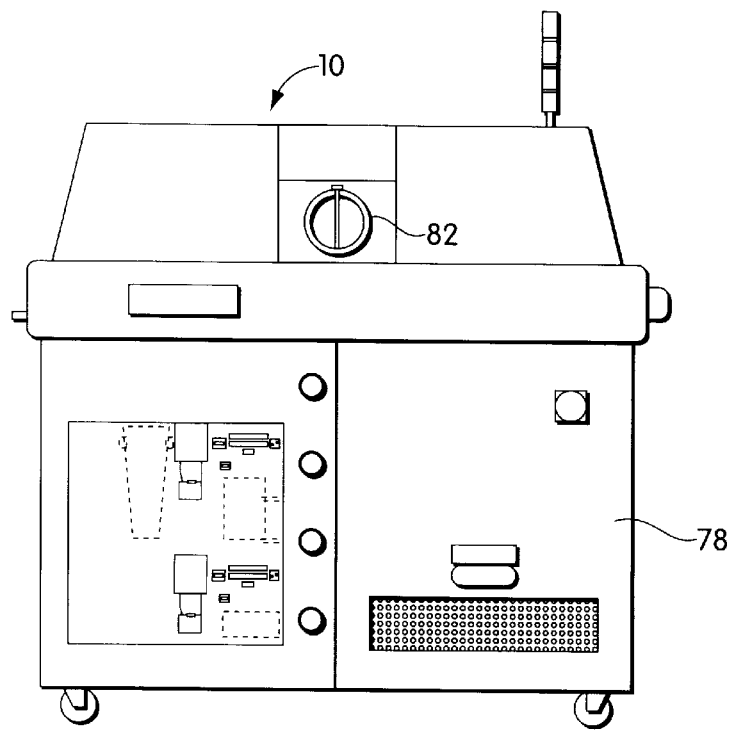
FIG. 7 is a back view of the embodiment.
Figure 8:
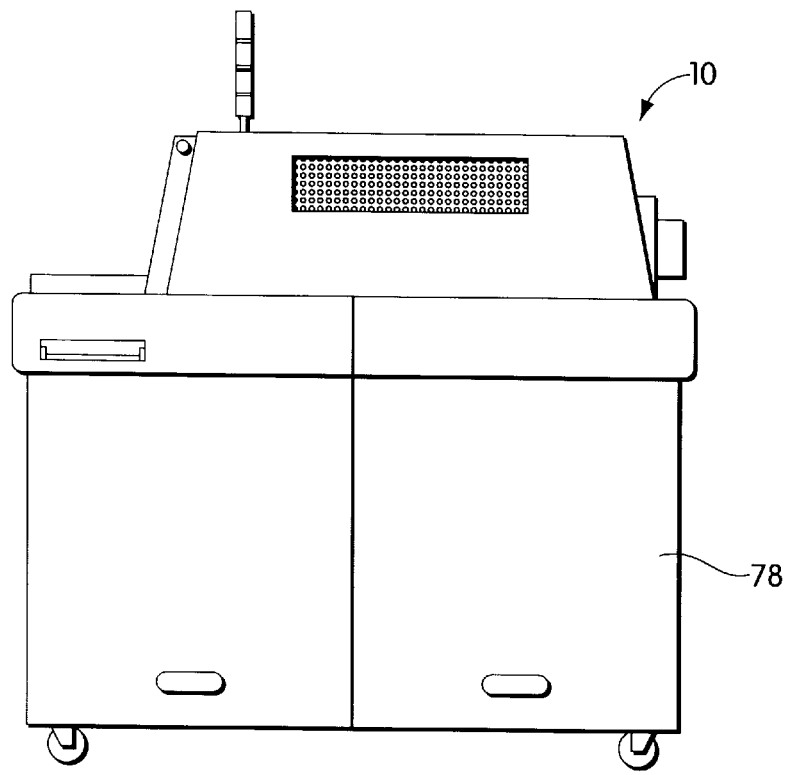
FIG. 8 is a first side view of the embodiment.
Figure 9:
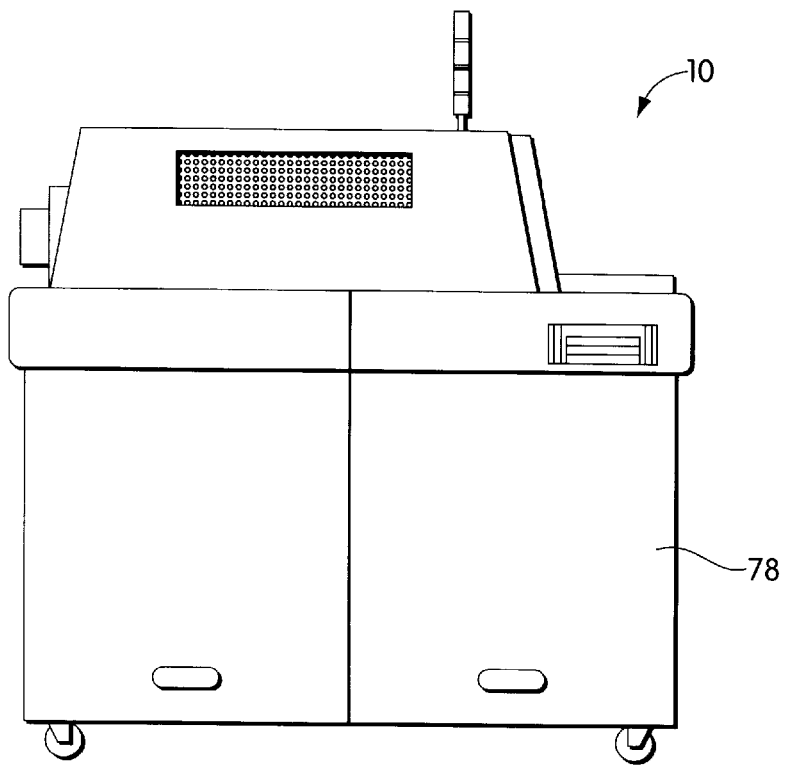
FIG. 9 is an opposite side view of the embodiment.
Figure 10:
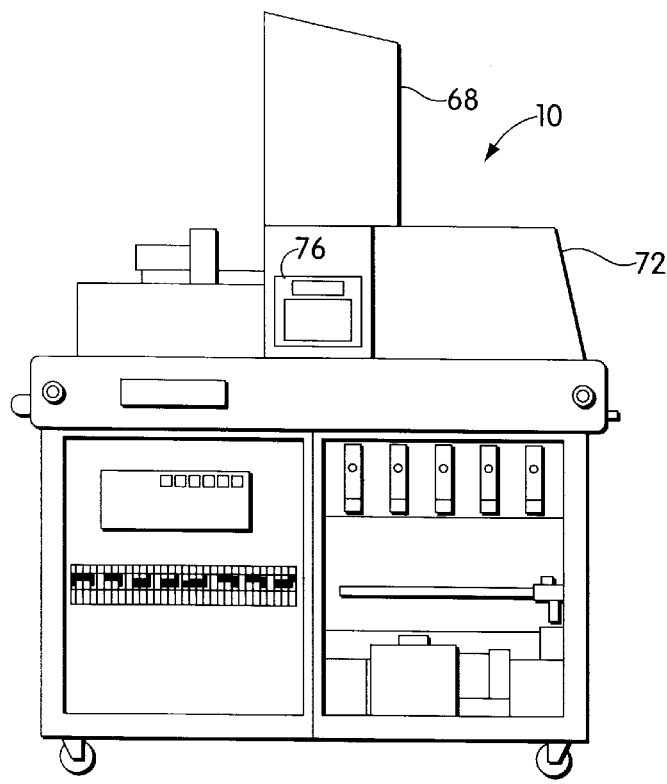
FIG. 10 is a front view illustrating the lid on the reflow assembly lifted.

FIG. 5 illustrates the use of apparatus 10 with individual trays 62 full of BGA components 15. These trays shown may be JEDEC-type trays of the type referred to above or other type, boat or carrier. The movement of trays 62 through apparatus 10 is substantially identical to the movement of strips 16 discussed above.

Figure 11:
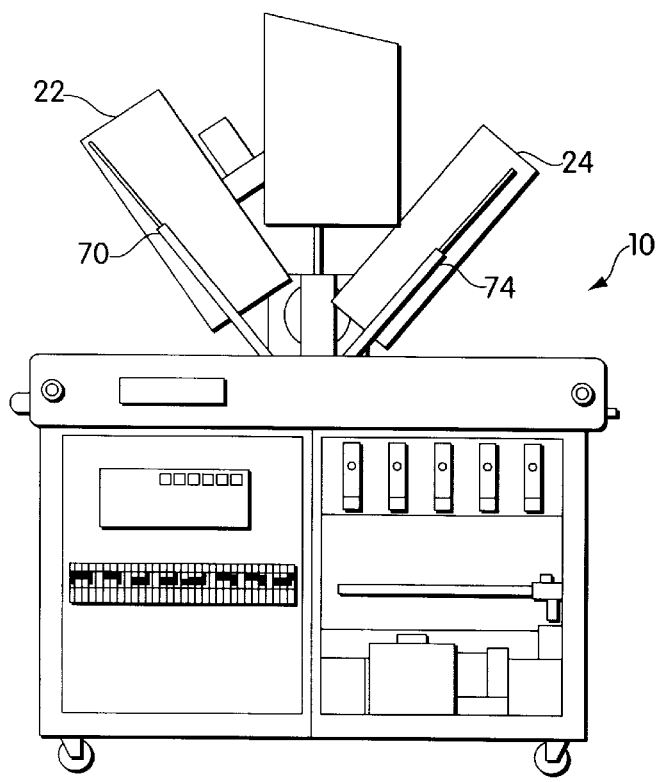
FIG. 11 is a front view of the embodiment illustrating the lids of the reflow assembly and cleaning assembly lifted.

With reference to FIGS. 6–12, the frame 12 can be seen to be mounted on wheels 66 to facilitate movement of the apparatus 10. Preferably, the reflow assembly 14 will be provided with a lid 68 which can be moved between the closed position, shown in FIGS. 6–9, to an open position, shown in FIG. 10, to access the reflow conveyor 22 and related equipment. Further, the reflow conveyor 22, itself, can be mounted on a pivoting apparatus for lifting to an inspection and repair position, as seen in FIG. 11, assisted by gas lift tubes 70. Similarly, the cleaning assembly 18 will include a lid 72 which can be moved to the open position and the cleaning conveyor 24 is pivotally mounted so it can be pivoted to an inspection and repair position, as seen in FIG. 11, supported by gas lift tubes 74.

A control panel 76 is mounted on the front 52 of the apparatus 10 for controlling the processes within the apparatus 10. Various panels 78 can be mounted on the frame 12 to conceal various components within the apparatus 10 necessary for its function. A negative pressure vent 80 is provided with an external exhaust duct 82 to draw gases from the machine if required. Inasmuch as the present invention incorporates what was formally two process steps in one piece of machinery in a unitary housing, the potential exists for gases, water vapor, flux, etc. to migrate from one conveyor to the other conveyor system, which is obviously undesirable. The negative pressure vent and external exhaust duct 82 acts to separate the two conveyors so that such contaminants do not flow from one area to the other thus further making the process of reflow and cleaning more efficient and quick.

Figure 13:
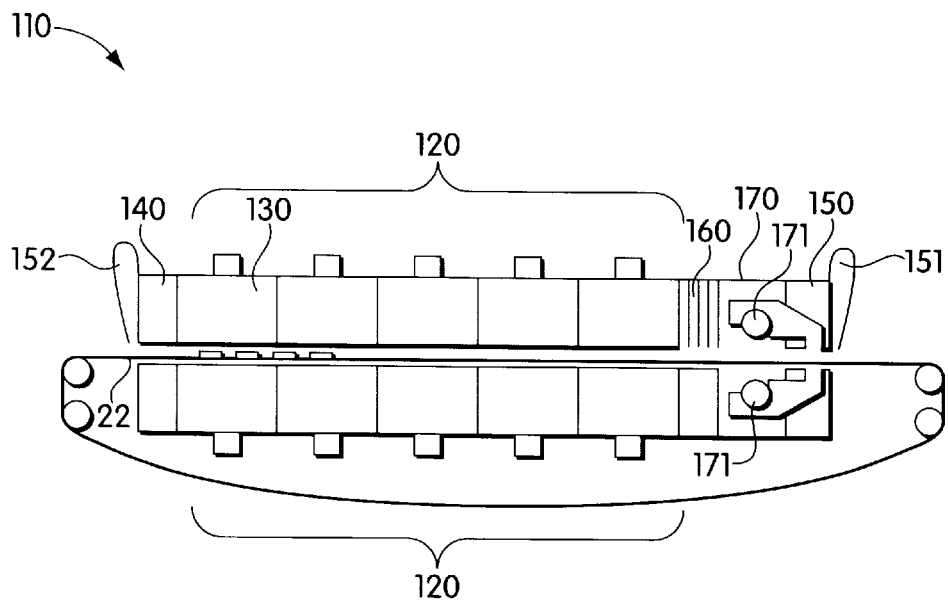
FIG. 13 is a side view of the reflow assembly and a convection reflow heating system.
Figure 14:
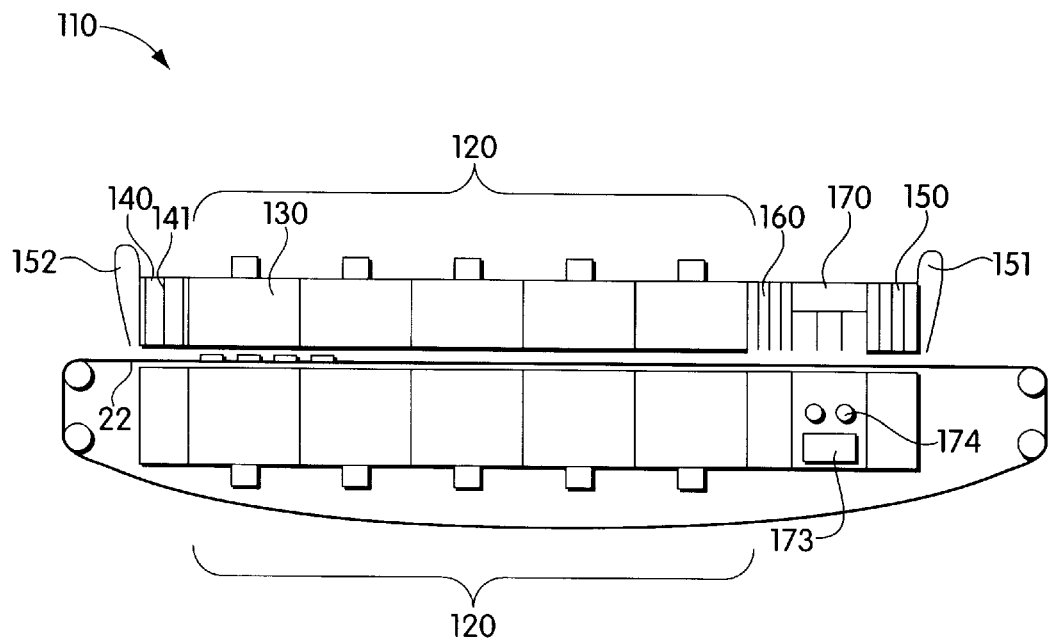
FIG. 14 is a side view of the reflow assembly and a convection reflow heating system for use with inert gas.
Figure 15:
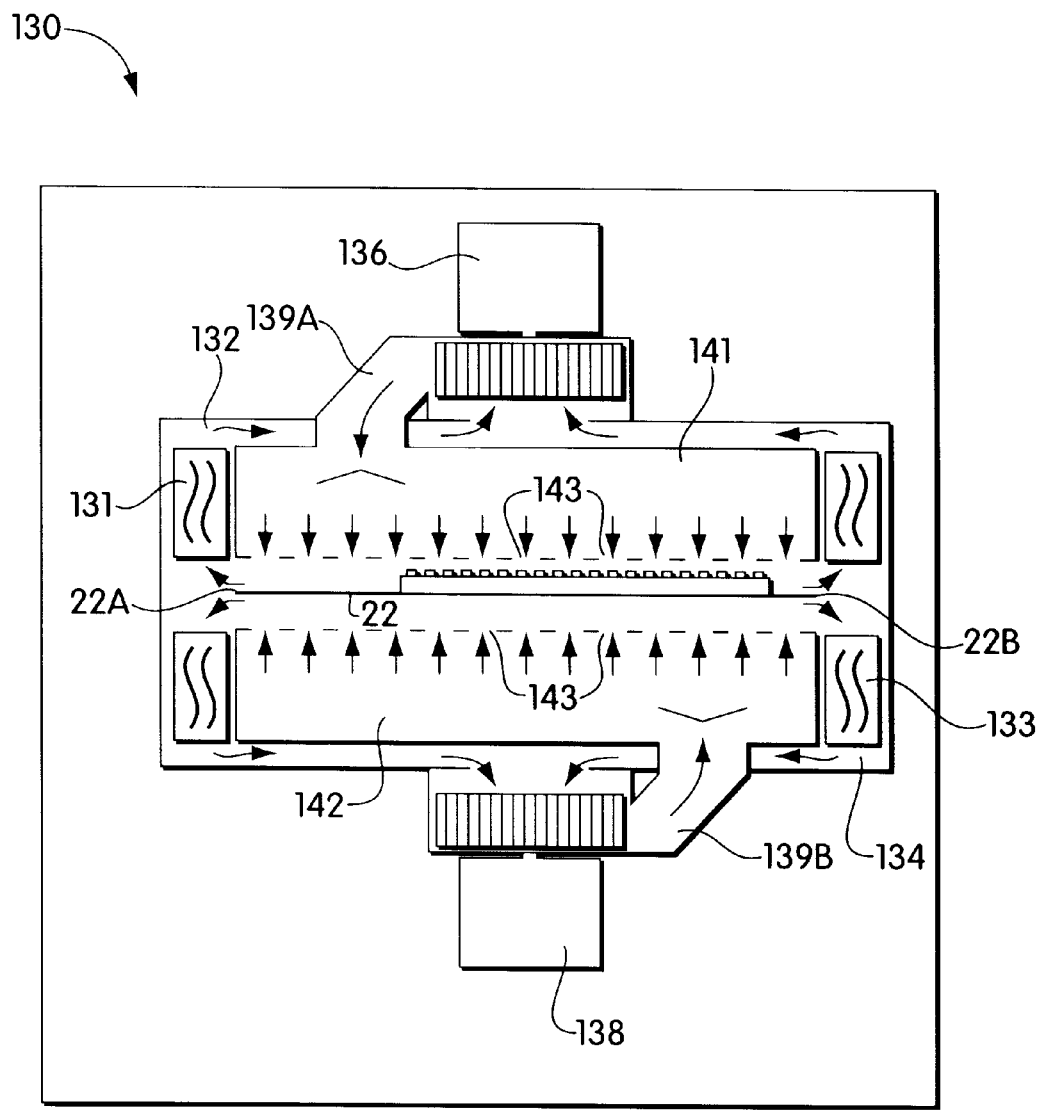
FIG. 15 is an end view of a reflow heating zone of the reflow assembly.

Another embodiment of the present invention illustrated in FIGS. 13–15 includes a convection reflow heating system 110 which utilizes either air or an inert gas, such as nitrogen, for heating conveyed electronic components in the reflow assembly 14. While, as pointed out above, an IR-type heating system has the advantage of bringing solder to a reflow temperature more quickly than a convection-type heating system, there are also advantages of using convection heating. One such advantage is that convection heating maintains air or gas at a reflow temperature which is equal to or slightly elevated from a desired reflow temperature of the electronic components. Convection heating also allows the electronic components to be uniformly elevated to the desired reflow temperature during the reflow process. BGA strips vary in material, thickness and color and this results in non-uniform absorption of radiant energy. However, since the reflow air or gas temperature is equal to or slightly elevated from the desired reflow temperature, the maximum temperature the BGAs can reach is no greater than the reflow air or inert gas temperature, and, with the amount of time the BGAs in their carriers spend in the reflow assembly, the temperature differentials, if any, across the BGAs and the carrier are allowed to equalize.

The convection reflow heating system of the present invention mixes heat and air or inert gas to create a uniform reflow air or gas temperature which is no greater than a safe reflow temperature. As the electronic components are conveyed through the reflow assembly, the resident time in the reflow assembly and the exposure to a uniform reflow temperature allows the temperature across the BGA strips to equalize, resulting in uniformly reflowed components.

As shown in FIGS. 13 and 14, the convection reflow heating system 110 of the reflow assembly includes a multiple number of reflow heating zones 120, an entry isolation zone 140 disposed at an entry point of the reflow conveyor 22, an exit isolation zone 150 disposed at an exit point of the reflow conveyor 22, a reflow-to-cooling isolation zone 160, and a cooling zone 170.

As shown in FIG. 15, each reflow heating zone 130 includes a first heater 131 disposed above the reflow conveyor and a second heater 133 disposed below the reflow conveyor. Each heater is coupled to a side intake duct 132 and 134 which is disposed adjacent opposing side edges 22A and 22B of the reflow conveyor 22. A first blower 136 is disposed above the reflow conveyor which delivers air or gas to the heating zone 130 by a first blower intake duct 139A. The first blower draws air or gas through the first heater 131 and the side intake duct 132 into a first plenum housing 141 disposed above the reflow conveyor in facing relation to a top surface of the reflow conveyor. Air or gas is heated as it is drawn through the heater and the side intake duct by the drawing action of the first blower. A second blower 138 is disposed below the reflow conveyor which similarly delivers air or gas by a second blower intake duct 139B. The second blower draws air or gas through the second heater 133 and the side intake duct 134 into a second plenum housing 142 disposed below the reflow conveyor in facing relation to a bottom surface of the reflow conveyor.

Each plenum is substantially uniformly pressurized by the intake of air or inert gas. The intake of air or gas also produces a positive pressure within each plenum which creates a mixing action of heat and air or gas. Such mixing action results in uniform air or gas temperature. The positive pressure uniformly discharges heated air or gas into the reflow heating zone through a multiple number of perforations 143 in a surface of each plenum facing the reflow conveyor. As the strip forms 16 or Jedec trays, boats or carriers 17 are conveyed through the reflow assembly, heated air or gas uniformly discharged from each plenum and impinges the top and bottom surfaces of the reflow conveyor to transfer heat to the components contained on the conveyor.

Air or gas is recirculated to the first and second heaters 131 and 133 and the side intake ducts 132 and 134 by the drawing action created by the first and second blowers 136 and 138. As FIG. 15 illustrates, the first and second blower intake ducts are alternately disposed adjacent to opposing sides of the reflow conveyor and at points above and below the reflow conveyor in a non-aligned relation.

As described above with respect to the first embodiment, the temperature in each of the reflow heating zones 130 is controlled by the use of thermocouples 42 which are monitored by appropriate circuitry of the reflow and cleaning apparatus. The thermocouples may be implemented using one of a number of thermocouples well know in the art to measure temperature.

Typically, in the present embodiment, the reflow temperature in the heating zone of the reflow assembly will be in the vicinity of 360° F. but may vary from about ambient to about 750° F., but usually not less than about approximately 375° F. during reflow. It is desirable that the temperature of an electronic component leaving the reflow assembly not be below that of the temperature of the wash water of the washing section. Typically, the water in the cleaning section may range from 120°–160° F. for the wash section and from about ambient to 210° F. for the rinse section. Suitable temperatures are about 125° F. for the wash water and between about 100° F. and 250° F. for the rinse water, but generally not less than about approximately 125° F. The temperatures of the reflow and the washing sections are maintained by temperature control devices well know in the art.

As discussed above in reference to FIG. 1, the total average time of processing of a single BGA strip or JEDEC tray, boat or carrier in the present embodiment is reduced from the conventional processing time of between 7 and 10 minutes. This is accomplished by the containment of the reflow assembly 14 and the cleaning assembly 18 in a unitary housing, the control of the reflow and cleaning temperatures, and the control of the speed of the conveying belts 22 and 24. In the present embodiment of the invention, cleaning begins to take place after reflow within 15 to 45 seconds after the BGA strip or JEDEC tray, boat or carrier containing components exit the reflow assembly.

The entry isolation zone 140 and the exit isolation zone 150 serve to achieve a uniform reflow temperature within the reflow assembly and across the reflow conveyor. The entry and the exit isolation zones function as areas of static atmosphere between the ambient conditions within the reflow and cleaning apparatus 10 and the elevated temperatures of the reflow assembly. The entry isolation zone is equipped with an exhaust port 152 which extracts flux particulates and other contaminants from the reflow assembly and exhausts them from the reflow and cleaning apparatus. Similarly, the exit isolation zone is equipped with an exhaust port 151 for extraction of contaminants.

The reflow-to-cooling zone 160 acts as a buffer zone between the elevated temperature of the reflow heating zones 120 and the cooler temperature of the cooling zone 170. The reflow-to-cooling zone also functions to isolate the reflow heating zones from the cooling zone to prevent the transfer of air or gas from one zone to another and the transfer of heat, by conduction, from one zone to another. The reflow-to-cooling zone also prevents the transfer of flux particulates and other contaminants from the reflow heating zones to the cooling zone, thereby reducing condensation of flux particles and contaminants on the conveyed electronic components in the cooling zone. The reflow-to-cooling zone provides the physical space to accomplish the isolation function between the reflow heating zones and the cooling zone. In addition, an exhausting device may be mounted at a top portion of the reflow-to-cooling zone to draw and exhaust from the reflow-to-cooling zone to the external atmosphere flux particles and other contaminants, as well as air or gas, which manage to travel from the reflow heating zones and the cooling zone into the reflow-to-cooling zone.

The cooling zone 170 reduces the temperature of the reflowed components prior to the components exiting the reflow assembly. As shown in FIG. 13, the cooling zone may be equipped with one or more blowers 171 disposed below the reflow conveyor which draw cool air from the atmosphere of the reflow and cleaning apparatus into the cooling zone. Cool air is delivered by the blowers directly to the bottom surface of the reflow conveyor thereby cooling the components contained on the reflow conveyor prior to the components exiting the reflow assembly. One or more blowers may be similarly disposed above the reflow conveyor to provide cool air to the top surface of the reflow conveyor.

In another embodiment of the invention, operation of the reflow assembly with an inert gas, such as nitrogen, includes a gas distribution system, as illustrated in FIG. 14. The gas distribution system delivers inert gas to the reflow assembly as described above with respect to FIG. 15. Delivery of inert gas produces a positive pressure within the reflow heating zones 120 which purges oxygen from the reflow heating zones, creating an inert environment within each heating zone 130.

The gas distribution system further includes a first seal 141 disposed within the entry isolation zone 140 and a second seal 151 disposed within the exit isolation zone 150. The seals enhance the isolation function of the entry and exit zones. The seals minimize the consumption of inert gas in the reflow assembly necessary to maintain the positive pressure within the reflow assembly. The seals also prevent oxygen from entering the reflow heating zones and inert gas from exiting the reflow assembly.

As shown in FIG. 14, the cooling zone 170 of the gas distribution system may incorporate a cooling radiator 173. One or more gas knives 174 or, alternatively, one or more gas blowers, may be disposed below the reflow conveyor for cooling the reflow components as they are conveyed through the cooling zone prior to exiting the reflow assembly. The gas knives deliver cool inert gas directly to the bottom surface of the reflow conveyor. As gas is discharged from the gas knives, inert gas from the reflow heating zones is drawn through and along a surface of the cooling radiator. Drawing inert gas into the cooling zone increases the effective volume of inert gas impinging surfaces of the components on the reflow conveyor.

As in the embodiment using IR type reflow heating, the reflow assembly is in a common housing. Further, when the BGA components in strip (or other) form emerge from the reflow assembly, they will be conveyed to the cleaning assembly. Because the temperature differential between the exit from the cooling zone of the reflow assembly and the entrance to the cleaning assembly is short, flux particulates and other contaminants may be easily washed off the BGAs in the cleaning assembly, since such contaminants have not cured or solidified. This results in a substantial savings of time and use of energy.

Although a number of embodiments of the present invention have been illustrated in the accompanying drawings and described in the foregoing detailed description, it will be understood that the invention is not limited to the embodiment disclosed, but is capable of numerous rearrangements, modifications and substitutions of parts and elements without departing from the scope and spirit of the invention.

What is claimed is:

1. An apparatus for reflowing solder on and cleaning an electronic component or assembly, comprising:
   a unitary housing containing a solder reflow assembly and a cleaning assembly;
   an inlet conveyor mounted in the housing to convey the electronic component or assembly to the solder reflow assembly,
   the solder reflow assembly being mounted in the housing and having a first conveyor which receives the electronic component or assembly from the inlet conveyor and conveys the electronic component or assembly in a reflow direction, wherein the solder reflow assembly includes a convection reflow heating system to raise the temperature in the solder reflow assembly to reflow solder on the electronic component or assembly;
   the cleaning assembly being mounted in the housing and having a second conveyor separate and independent from the first conveyor, the second conveyor being oriented generally in a direction opposite from and parallel to the first conveyor to convey the electronic component or assembly in a cleaning direction, the first and second conveyors being coplanar, wherein the cleaning assembly includes a mechanism to provide wash water and rinse water at elevated temperatures; and
   a plurality of movable sweeping members, the sweeping members moving the electronic component or assembly from the inlet conveyor to the beginning of the first conveyor and from the end of the first conveyor to the beginning of the second conveyor and from the end of the second conveyor to a mechanism to move the electronic component or assembly out of the apparatus.

2. The apparatus of claim 1, wherein the reflow direction and the cleaning direction are perpendicular to a direction in which the inlet conveyor conveys the electronic component or assembly and a direction in which the outlet mechanism moves the electronic component or assembly out of the apparatus.

3. The apparatus of claim 1, wherein the electronic component or assembly is one of a plurality of electronic components or assemblies in strip form.

4. The apparatus of claim 1, wherein one or more electronic components or assemblies are carried in trays, boats or carriers.

5. The apparatus of claim 1, further comprising a negative pressure vent and a gas control mechanism to separate the solder reflow assembly from the cleaning assembly and to prevent contaminants from traveling from the solder reflow assembly to the cleaning assembly and from the cleaning assembly to the solder reflow assembly.

6. The apparatus of claim 1, wherein the convection reflow heating system of the solder reflow assembly comprises:
  a first isolation zone disposed at an entry point of the first conveyor to separate temperature conditions exterior of the solder reflow assembly from a temperature of the solder reflow assembly;
  at least one heating zone disposed adjacent to the first isolation zone, wherein solder on the electronic component or assembly is reflowed as the electronic component or assembly is conveyed by the first conveyor;
  a cooling zone disposed adjacent to the heating zone, wherein the electronic component or assembly is cooled prior to exiting the solder reflow assembly as the electronic component or assembly is conveyed by the first conveyor;
  a buffer zone disposed between the heating zone and the cooling zone to provide a physical space between the heating and cooling zones;
  a second isolation zone disposed adjacent to the cooling zone at an exit point of the first conveyor to separate the temperature of the solder reflow assembly from temperature conditions exterior of the solder reflow assembly;
  a gas distribution system disposed in the solder reflow assembly to deliver heated air or inert gas to the heating zone to reflow solder on the electronic component or assembly, to recirculate discharged air or insert gas within the heating zone, and to deliver cool air or inert gas to the cooling zone; and
  one or more temperature sensors disposed in the solder reflow assembly to control the temperatures within the solder reflow assembly at desired values.

7. The apparatus of claim 6, wherein the gas distribution system comprises:
  a first heater disposed adjacent to a first side edge of the first conveyor and coupled to a first blower disposed above the first conveyor, wherein the first blower delivers air or inert gas to the heating zone, and draws discharged air or inert gas from within the heating zone and through the first heater to heat and recirculate air or inert gas; and
  a second heater disposed adjacent to a second side edge of the first conveyor and coupled to a second blower disposed below the first conveyor, wherein the second blower delivers gas to the heating zone, and draws discharged air or inert gas from within the heating zone and through the second heater to heat and recirculate air or inert gas.

8. The apparatus of claim 7, further comprising a first plenum disposed above the first conveyor and coupled to the first blower by a first intake duct into which the first blower delivers air or inert gas, the first plenum having a pressure greater than exterior of the solder reflow assembly to mix heat and air or inert gas and to discharge air or inert gas through a plurality of perforations to a top surface of the first conveyor.

9. The apparatus of claim 7, further comprising a second plenum disposed below the first conveyor and coupled to the second blower by a second intake duct into which the second blower delivers air or inert gas, the second plenum having a pressure greater than exterior of the solder reflow assembly to mix heat and air or inert gas and to discharge air or inert gas through a plurality of perforations to a bottom surface of the first conveyor.

10. The apparatus of claim 6, wherein the first isolation zone is equipped with a seal to prevent exterior air from entering the solder reflow assembly.

11. The apparatus of claim 6, wherein the second isolation zone is equipped with a seal to prevent heated gas from exiting the solder reflow assembly.

12. The apparatus of claim 6, wherein the first isolation zone is equipped with an exhaust port to extract air borne contaminants from the solder reflow assembly and exhaust the contaminants to the atmosphere exterior to the apparatus.

13. The apparatus of claim 6, wherein the second isolation zone is equipped with an exhaust port to extract air borne contaminants from the solder reflow assembly and exhaust the contaminants to the atmosphere exterior to the apparatus.

14. The apparatus of claim 6, wherein the cooling zone is equipped with at least one blower disposed above the first conveyor to deliver cool gas to a top surface of the first conveyor to cool the electronic component or assembly conveyed thereon.

15. The apparatus of claim 6, wherein the cooling zone is equipped with a cooling radiator disposed below the first conveyor and coupled to at least one discharge device disposed below the first conveyor to deliver cool gas to the electronic component or assembly on the first conveyor, whereby
  the discharge device draws gas from within the atmosphere of the apparatus across a surface of the cooling radiator to cool the gas prior to delivery of the gas to the first conveyor and to increase a volume of the gas delivered.

16. The apparatus of claim 15, wherein the discharge device is a gas knife.

17. The apparatus of claim 15, wherein the discharge device is a gas blower.

18. The apparatus of claim 1, wherein the convection reflow heating system is operable to control the temperature in the solder reflow assembly in a range of about ambient to about 750° F.

19. The apparatus of claim 1, wherein the cleaning assembly mechanism to control the temperatures of the wash and rinse waters is operable to control the temperature of the wash water in a range of about 120° F. to about 160° F., and to control the temperature of the rinse water in a range of about 120° F. to about 210° F.

20. The apparatus of claim 1, wherein the convection reflow heating system is operable to control the temperature in the solder reflow assembly in a range of about ambient to about 750° F., and the cleaning assembly mechanism to control the temperatures of the wash and rinse waters is operable to control the temperatures of the wash and rinse waters in a range of about ambient to about 210° F.

21. The apparatus of claim 1, wherein the cleaning assembly mechanism to control the temperatures of the wash and rinse waters is operable to control the temperatures of the wash and rinse waters in a range of about ambient to about 210° F., wherein the temperature differential between the wash and rinse waters and the solder reflow assembly is between about 750° F. and about 50° F.

22. The apparatus of claim 1, wherein the cleaning assembly mechanism to control the temperatures of the wash and rinse waters is operable to control the temperature of the wash water at about 125° F. and to control the temperature of the rinse water in a range of about 100° F. to about 210° F.

23. The apparatus of claim 1, wherein the convection reflow heating system is operable to control the temperature in the solder reflow assembly to not less than about 375° F., and the cleaning assembly mechanism to control the temperatures of the wash and rinse waters is operable to control the temperatures of the rinse and water waters to not less than about 125° F.

24. The apparatus of claim 1, wherein the solder reflow assembly is arranged and configured and the convection reflow heating system is operable to control the temperature in the solder reflow assembly such that the electronic component or assembly exits the solder reflow assembly at a temperature above a solidification temperature to cure a flux or other contaminants contained in a solder attached to the electronic component or assembly.

25. The apparatus of claim 1, wherein the solder reflow assembly further includes one or more sensors to activate the sweeping members to convey the electronic component or assembly from the solder reflow assembly to the wash water of the cleaning assembly within a desired period of time such that the temperature of the electronic component or assembly is above the temperature of the wash water.

26. The apparatus of claim 1, wherein the solder reflow assembly further includes one or more sensors to activate the sweeping members to convey the electronic component or assembly from the solder reflow assembly to the wash water of the cleaning assembly within a period of time ranging from about 1 to about 120 seconds such that the temperature of the electronic component or assembly is above the temperature of the wash water.

27. The apparatus of claim 6, wherein the cooling zone is equipped with at least one blower disposed below the first conveyor to deliver cool gas to the bottom surface of the first conveyor.

* * * * *

UNITED STATES PATENT AND TRADEMARK OFFICE
CERTIFICATE OF CORRECTION

PATENT NO. : 6,354,481 B1
DATED : March 12, 2002
INVENTOR(S) : Rich et al.

It is certified that error appears in the above-identified patent and that said Letters Patent is hereby corrected as shown below:

<u>Column 15,</u>
Line 14, change "rinse and water waters" to -- wash and rinse waters --.

Signed and Sealed this

Twentieth Day of August, 2002

Attest:

JAMES E. ROGAN
Attesting Officer    Director of the United States Patent and Trademark Office